(12) United States Patent
Wu et al.

(10) Patent No.: US 9,865,681 B1
(45) Date of Patent: Jan. 9, 2018

(54) NANOWIRE TRANSISTORS HAVING MULTIPLE THRESHOLD VOLTAGES

(71) Applicant: GLOBALFOUNDRIES INC., Grand Cayman (KY)

(72) Inventors: Xusheng Wu, Ballston Lake, NY (US); John Zhang, Albany, NY (US); Jiehui Shu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/453,170

(22) Filed: Mar. 8, 2017

(51) Int. Cl.
| | |
|---|---|
| *H01L 29/06* | (2006.01) |
| *H01L 21/02* | (2006.01) |
| *H01L 21/306* | (2006.01) |
| *H01L 21/28* | (2006.01) |
| *H01L 29/423* | (2006.01) |
| *H01L 29/51* | (2006.01) |
| *H01L 29/49* | (2006.01) |
| *H01L 29/66* | (2006.01) |

(52) U.S. Cl.
CPC ...... *H01L 29/0673* (2013.01); *H01L 21/0214* (2013.01); *H01L 21/0217* (2013.01); *H01L 21/0262* (2013.01); *H01L 21/02181* (2013.01); *H01L 21/02532* (2013.01); *H01L 21/02639* (2013.01); *H01L 21/28088* (2013.01); *H01L 21/30604* (2013.01); *H01L 29/42392* (2013.01); *H01L 29/4966* (2013.01); *H01L 29/517* (2013.01); *H01L 29/66545* (2013.01); *H01L 29/66568* (2013.01)

(58) Field of Classification Search
CPC ........... H01L 51/4266; H01L 21/02606; H01L 51/0048; H01L 21/76808
See application file for complete search history.

(56) References Cited

U.S. PATENT DOCUMENTS

2003/0227013 A1* 12/2003 Currie ............. H01L 21/823412
257/19

* cited by examiner

*Primary Examiner* — Mohammad Choudhry
(74) *Attorney, Agent, or Firm* — Scully Scott Murphy and Presser; Frank Digiglio

(57) ABSTRACT

Multi-threshold voltage ($V_t$) nanowire devices are fabricated using a self-aligned methodology where gate cavities having a predetermined geometry are formed proximate to channel regions of respective devices. The gate cavities are then backfilled with a gate conductor. By locally defining the cavity geometry, the thickness of the gate conductor is constrained and hence the threshold voltage for each device can be defined using a single deposition process for the gate conductor layer. The self-aligned nature of the method obviates the need to control gate conductor layer thicknesses using deposition and/or etch processes.

20 Claims, 7 Drawing Sheets

NANOWIRE TRANSISTORS HAVING MULTIPLE THRESHOLD VOLTAGES

BACKGROUND

The present application relates generally to semiconductor devices, and more particularly to nanowire transistors having different threshold voltages.

As microelectronic device dimensions scale past the 15 nm node, achieving high mobility and short channel control remains a challenge in device design and fabrication. Nanowires used to fabricate devices may provide improved short channel control.

Nanowire devices, where a nanoscale structure of semiconductor material forms the channel region of the device, may be fabricated to have one or more different device characteristics, such as switching speed, power consumption, leakage, etc. Multiple different designs may provide design flexibility for one or more of these characteristics for devices intended to perform specific functions. For instance, one design may increase switching speed for devices providing computational logic functions, and another design may decrease power consumption for devices providing memory storage functions.

A system using multiple discrete devices tailored for different functions, however, presents challenges in terms of manufacturing, system complexity, system footprint, and cost.

SUMMARY

Disclosed are methods for forming nanowire devices having multiple threshold voltages, which enable disparate device characteristics across a plurality of such devices on a single substrate or chip. Exemplary methods include forming a first nanowire device on a semiconductor substrate within a first region thereof, and forming a second nanowire device on the substrate within a second region thereof. In exemplary architectures, the nanowire devices are nanowire field effect transistors (FETs). The first nanowire field effect transistor can include a first gate stack configuration and a first threshold voltage. The second nanowire field effect transistor can include a second gate stack configuration and a second threshold voltage.

In accordance with embodiments of the present application, a method of forming a structure includes depositing a first sacrificial layer on a semiconductor substrate, where the first sacrificial layer has a first thickness in a first region of the substrate and a second thickness greater than the first thickness in a second region of the substrate, and depositing a first semiconductor layer on the first sacrificial layer.

A second sacrificial layer is then deposited on the first semiconductor layer, where a thickness of the second sacrificial layer within the first region of the substrate is substantially equal to the first thickness, and a thickness of the second sacrificial layer within the second region of the substrate is substantially equal to the second thickness.

In various embodiments, the method continues by depositing a second semiconductor layer on the second sacrificial layer, and then selectively etching the first and second sacrificial layers to form first cavities within the first region and second cavities within the second region.

A gate dielectric layer is deposited on the first semiconductor layer within the first cavities and on the second semiconductor layer within the second cavities. A work function metal layer is deposited on the dielectric layer within the first cavities and on the dielectric layer within the second cavities, such that the work function metal layer substantially fills the first and second cavities.

In particular embodiments, a blocking mask can be formed over the first sacrificial layer within the first region of the substrate, and over the second sacrificial layer within the first region of the substrate in order to control the deposition of the additional first and second sacrificial layer materials.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
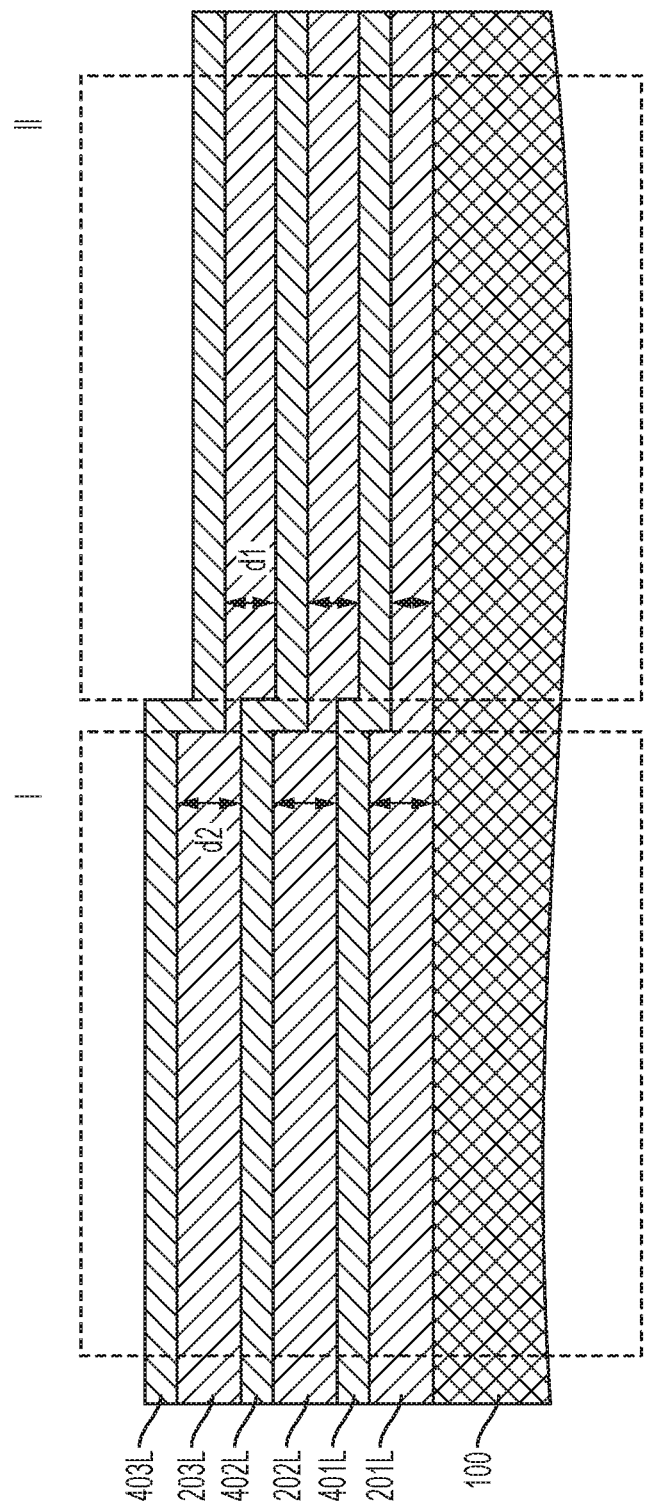
FIG. 1 is a schematic cross-sectional diagram of a semiconductor nanowire device at an intermediate stage of fabrication according to various embodiments, including plural first sacrificial gate layers within a first device region of a semiconductor substrate and plural second sacrificial gate layers within a second device region of the semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

Proportions of various elements in the accompanying drawings are not necessarily drawn to scale. As used herein, ordinals such as "first" and "second" are used merely to distinguish similar elements, and different ordinals may be used to designate the same element in the specification and/or the claims.

According to various embodiments, multi-threshold voltage ($V_t$) nanowire devices are fabricated using a self-aligned technique wherein gate cavities having a predetermined geometry are formed proximate to channel regions of respective devices. The gate cavities are then backfilled with a gate conductor. By locally defining the gate cavity geometry, the thickness of the gate conductor and hence the threshold voltage for each device can be tuned using a single deposition process for the gate conductor layer. The self-aligned nature of the process allows plural devices having different threshold voltages to be manufactured on a single substrate or chip.

The semiconductor devices can be configured so that a threshold voltage ($V_t$) of a particular device can be tuned using gate stack configuration differentiation. Threshold voltage tuning using gate stack configuration differentiation can be performed using gate stack configuration differentiation with differentiation of one or more other fabrication parameters or without differentiation of one or more other fabrication parameters. In specific embodiments, threshold voltage tuning involves controlling the deposited thickness of a work function metal layer, which forms a portion of the gate conductor layer for a device.

The work function of a material is an electrical property that describes the minimum energy required to remove an electron from the material. The work function layer of a gate structure, therefore, is a material layer that directly impacts the threshold voltage because it influences the amount of energy required for electrons to flow from the gate structure to a gate contact and thus influences the amount of energy available to attract charge carriers in a channel underlying the gate. In various embodiments described herein, providing different gate stack configurations can be useful in defining different threshold voltages.

Exemplary devices include a first nanowire field effect transistor formed on semiconductor substrate within a first region thereof, and a second nanowire field effect transistor formed on the substrate structure within a second region thereof. The first nanowire field effect transistor can include a first gate stack configuration and a first threshold voltage. The second nanowire field effect transistor can include a second gate stack configuration and a second threshold voltage. Notwithstanding the foregoing example, it will be appreciated that although various embodiments are described herein with reference to first and second nanowire devices, additional, i.e., third, fourth, fifth, sixth, etc., nanowire devices are contemplated.

Referring to FIG. 1, an exemplary nanowire structure at an intermediate stage of fabrication and according to various embodiments includes a plurality of sacrificial gate layers 201L, 202L, 203L stacked alternately with a plurality of semiconductor layers 401L, 402L, 403L within each of a first device region (I) and a second device region (II) of a semiconductor substrate 100.

The sacrificial gate layers 201L, 202L, 203L define a spacing (d) between adjacent semiconductor layers 401L, 402L and 402L, 403L, as well as between the first semiconductor layer 401L and the substrate 100. Within the first device region (I) of the semiconductor substrate 100, the sacrificial gate layers 201L, 202L, 203L may each be characterized by a thickness (i.e., intra-semiconductor layer spacing) d2, whereas in the second device region (II) of the semiconductor substrate 100, the sacrificial gate layers 201L, 202L, 203L may each be characterized by a thickness (i.e., intra-semiconductor layer spacing) d1, where d2>d1.

As described in further detail below, the structure shown in FIG. 1 can be used to form first and second nanowire devices having first and second threshold voltages, respectively. A nanowire device as referred to herein can include, e.g., a component of a nanowire FET formed on a substrate, a nanowire FET formed on a substrate, a plurality of nanowire FETs formed on a substrate, or a nanowire device having a plurality of nanowire FETs formed on a substrate.

Figure 10:
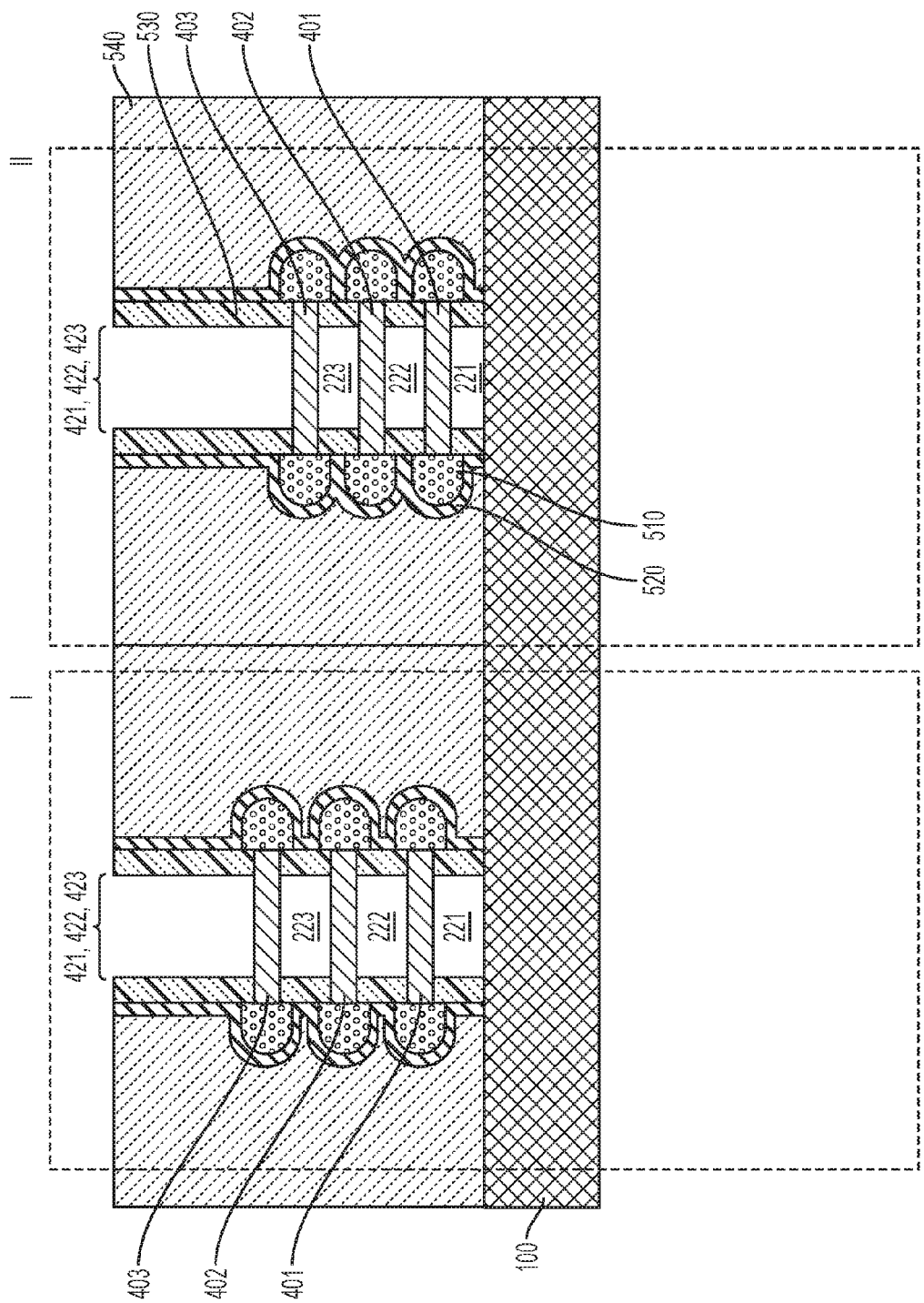
FIG. 10 shows an exemplary device architecture within first and second device regions following a selective etch of the sacrificial gate layers to expose the semiconductor layers and form a plurality of nanowires with adjacent gate cavities.
Figure 11:
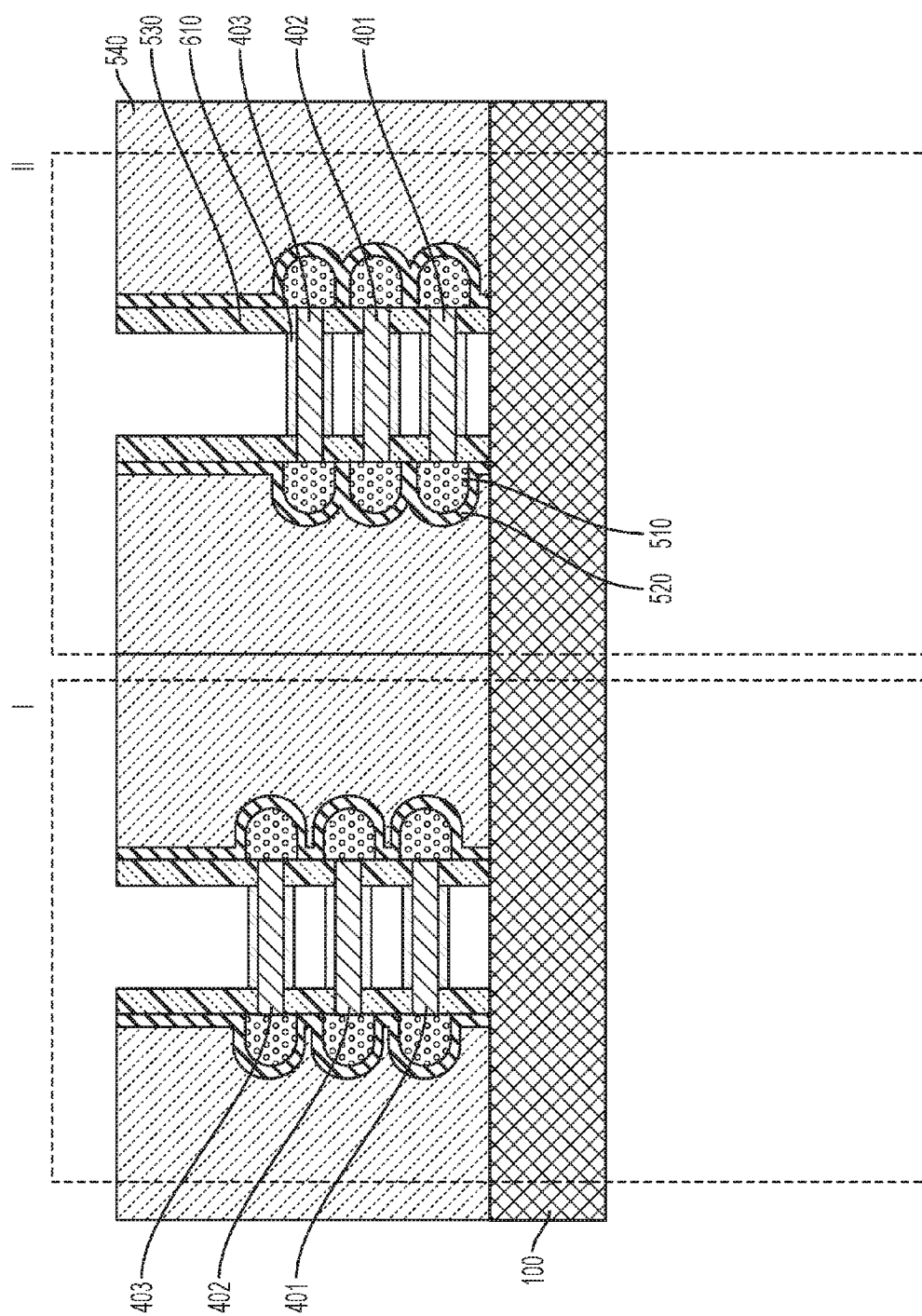
FIG. 11 depicts the deposition of a gate dielectric layer within the gate cavities and over exposed portions of semiconductor channel regions defined by the nanowires.
Figure 12:
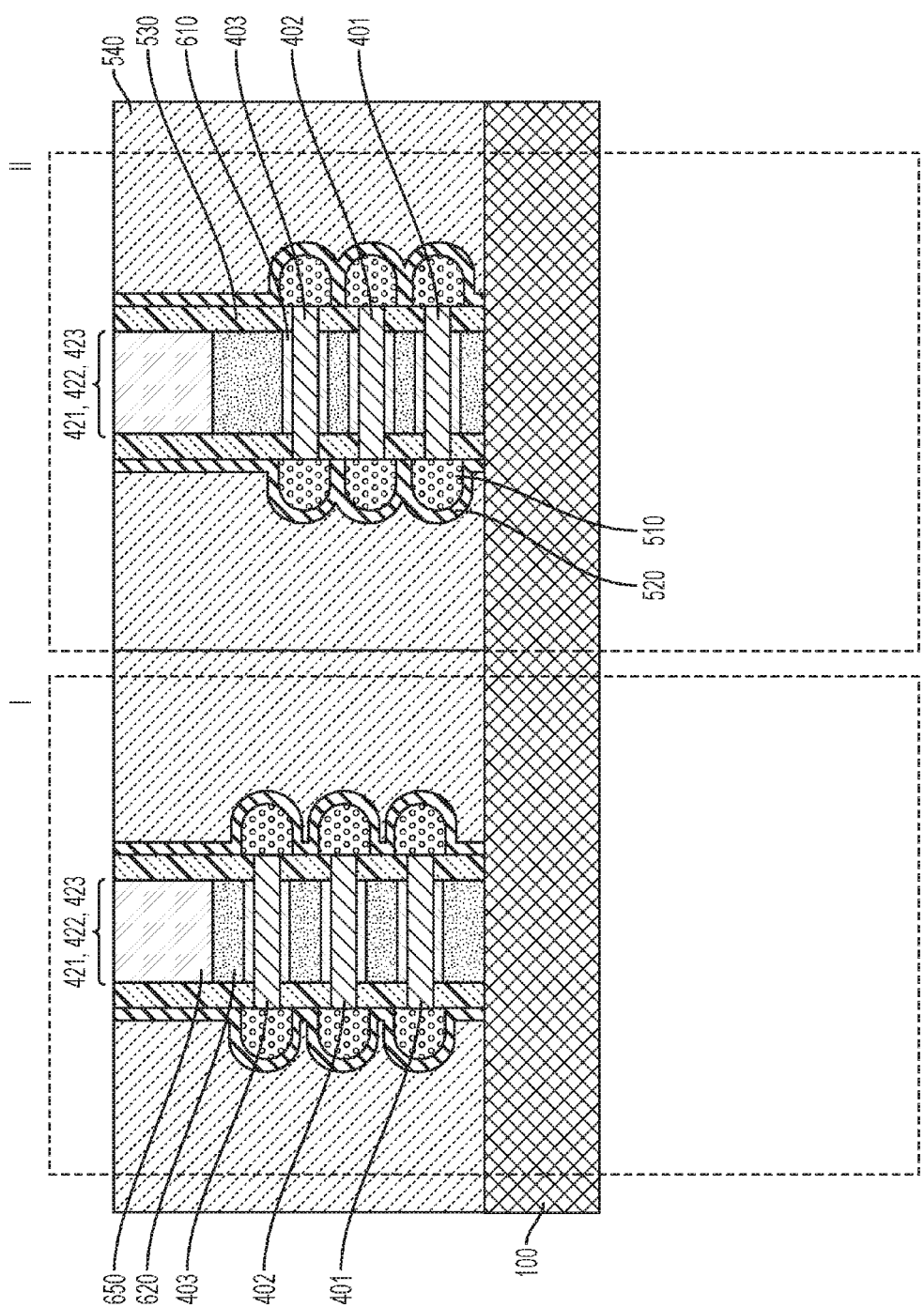
FIG. 12 shows the deposition of a gate conductor filling remaining portions of the gate cavities, followed by the deposition of a conductive fill layer.

By way of a non-limiting example, with reference still to FIG. 1, the first device region architecture may be adapted to form a regular threshold voltage (RVT) nFET device, while the second device region architecture may be adapted to form a low threshold voltage (LVT) nFET device. Alternatively, and by way of a further non-limiting example, the first device region architecture may be adapted to form a low threshold voltage (LVT) pFET device, while the second device region architecture may be adapted to form a regular threshold voltage (RVT) pFET device. Methods for forming the structure of FIG. 1 are described herein with reference to FIGS. 2-9. Exemplary device structures at various stages of manufacture are illustrated in FIGS. 10-12.

Figure 2:
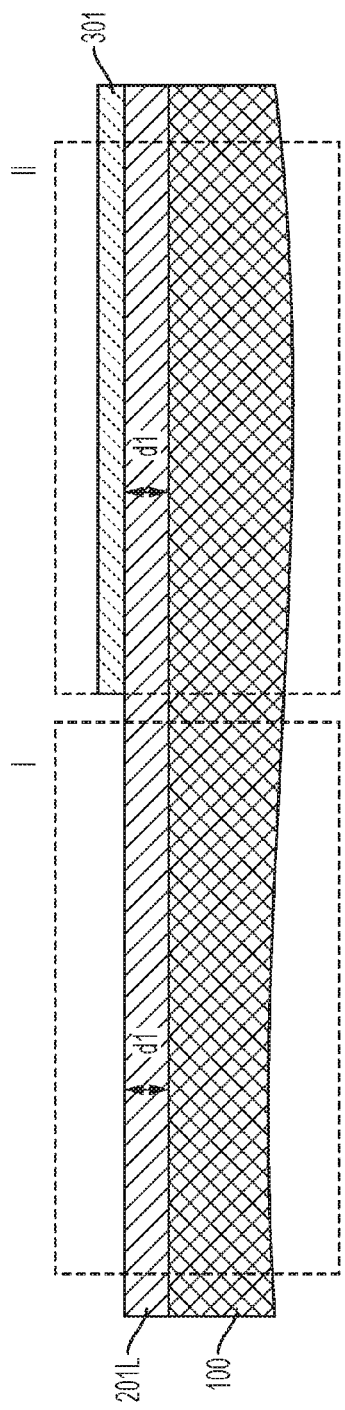
FIG. 2 shows the deposition onto the semiconductor substrate of a first sacrificial gate layer having a first thickness and the formation of a hard mask over the first sacrificial gate layer within the second device region of the substrate.
Figure 3:
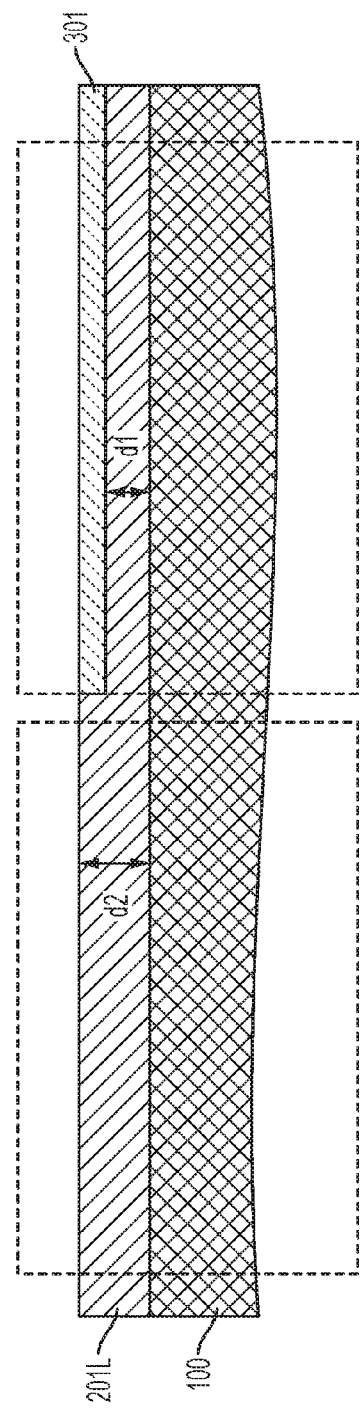
FIG. 3 depicts the selective deposition of additional sacrificial gate layer material within the first device region to form a sacrificial gate layer within the first device region having a second thickness greater than the first thickness.

Referring to FIG. 2, a first sacrificial gate layer 201L is formed over a semiconductor substrate 100. In certain embodiments, the semiconductor substrate 100 may comprise a semiconductor-on-insulator (SOI) substrate including a vertical stack, from bottom to top, of a handle substrate, a buried insulator layer, and a top semiconductor layer (not separately shown). Alternatively, a bulk semiconductor substrate 100 such as a silicon substrate can be employed in lieu of an SOI substrate.

The first sacrificial gate layer 201L may be formed by epitaxial growth to have a uniform thickness (d1) over first and second device regions (I, II) of the substrate 100. The thickness d1 may range from 1 to 20 nm, e.g., 1, 2, 4, 6, 8, 10, 12, 14, 16, 18 or 20 nm, including ranges between any of the foregoing values, although lesser and greater d1 thicknesses are contemplated.

The terms "epitaxy," "epitaxial" and/or "epitaxial growth and/or deposition" as used herein refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation.

In exemplary embodiments, first sacrificial gate layer 201L comprises epitaxially grown silicon germanium (SiGe) and a top surface of semiconductor substrate comprises silicon (Si). Thus, in the present embodiment, first sacrificial gate layer 201L may be grown by hetero-epitaxy on the semiconductor substrate. In the processes described herein, epitaxial layers may be formed using molecular beam epitaxy or chemical vapor deposition processes that are adapted for selective epitaxy.

An example silicon germanium epitaxial process for forming first sacrificial gate layer 201L uses a gas mixture including dichlorosilane ($SiH_2Cl_2$), germane ($GeH_4$) and hydrogen at a deposition (e.g., substrate) temperature of 600-800° C. Other suitable gas sources for silicon include silicon tetrachloride ($SiCl_4$), silane ($SiH_4$), trichlorosilane ($SiHCl_3$), and other hydrogen-reduced chlorosilanes ($Si-H_xCl_{4-x}$). Other suitable gas sources for germanium include $Ge_2H_6$.

Referring still to FIG. 2, a hard mask layer 301 is then formed over the first sacrificial gate layer 201L within the second device region (II). The hard mask layer 301 may be selectively deposited within the second device region (II), or a blanket hard mask layer may be deposited over the first sacrificial gate layer 201L within both first and second device regions and then removed from the first device region (I) using patterning and etching processes known to those skilled in the art.

For instance, the patterning process may comprise photolithography, which includes forming a layer of photoresist material (not shown) atop a material layer to be patterned. The photoresist may include a positive-tone photoresist composition, a negative-tone photoresist composition, or a hybrid-tone photoresist composition. A layer of photoresist may be formed by a deposition process such as, for example, spin-on coating.

The deposited photoresist is then subjected to a pattern of irradiation, and the exposed photoresist is developed utilizing a conventional resist developer. The pattern provided by the patterned photoresist is thereafter transferred into the underlying hardmask layer 301 utilizing at least one pattern transfer etching process.

The pattern transfer etching process may be an isotropic or an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Hard mask layer 301 may include a material such as, for example, silicon nitride or silicon oxynitride, and may be deposited using conventional deposition processes, such as, for example, CVD or plasma-enhanced CVD (PECVD).

Thus, hardmask 301 can cover device region II whereas the hardmask 301 is patterned to leave sacrificial gate layer 201L within device region I exposed. With hardmask 301 in place, the thickness of sacrificial gate layer 201L within device region I can be increased, e.g., from d1 to d2, by epitaxial growth within the first device region. Specifically, referring to FIG. 3, using the patterned hard mask layer 301 as a block mask, a homo-epitaxial process is used to deposit additional sacrificial gate layer material within the first device region to form a sacrificial gate layer 201L within the first device region (I) having a second thickness (d2) greater than the first thickness (d1). That is, in the illustrated embodiment, the further epitaxial process is used to deposit additional silicon germanium onto the exposed surface of the previously-formed silicon germanium layer 201L.

In various embodiments, the additional silicon germanium material is deposited over the pre-existing sacrificial gate layer 201L without deposition onto exposed surfaces of the hardmask 301, i.e., within device region II.

In certain embodiments, the thickness d2 may range from 5% to 400% greater than the thickness d1, e.g., 5, 10, 20, 50, 100, 150, 200, 250, 300, 350 or 400% greater, including ranges between any of the foregoing values. By way of example, the thickness d2 may range from 1 to 30 nm, e.g., 1, 2, 3, 4, 5, 6, 7, 8, 9, 10, 15, 20, 25 or 30 nm, including ranges between any of the foregoing values, although lesser and greater d2 thicknesses are contemplated.

Figure 4:
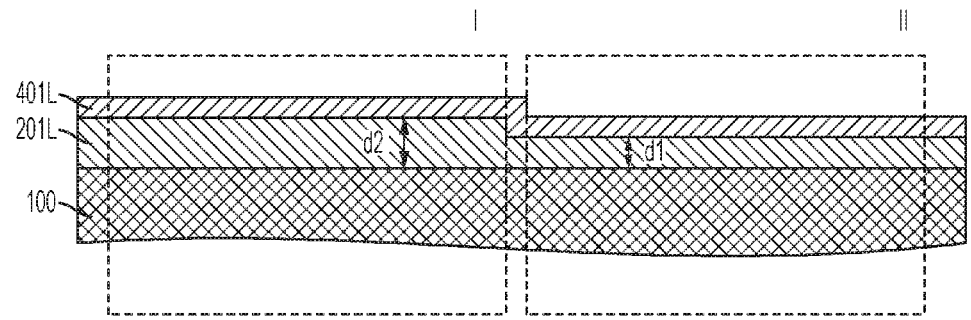
FIG. 4 shows the blanket deposition of a first semiconductor layer over the first sacrificial gate layer in each of the first and second device regions.

Referring to FIG. 4, following the thickness modification of the first sacrificial gate layer 201L within the first device region (I), the nitride hard mask 301 is stripped and a first semiconductor layer 401L is formed over the first sacrificial gate layer 201L in each of the first and second device regions.

In exemplary embodiments, first semiconductor layer 401L comprises silicon (Si) and is formed by a hetero-epitaxial process. An example silicon epitaxial process for forming first semiconductor layer 401L uses a gas mixture including dichlorosilane ($SiH_2Cl_2$) and hydrogen at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

Figure 5:
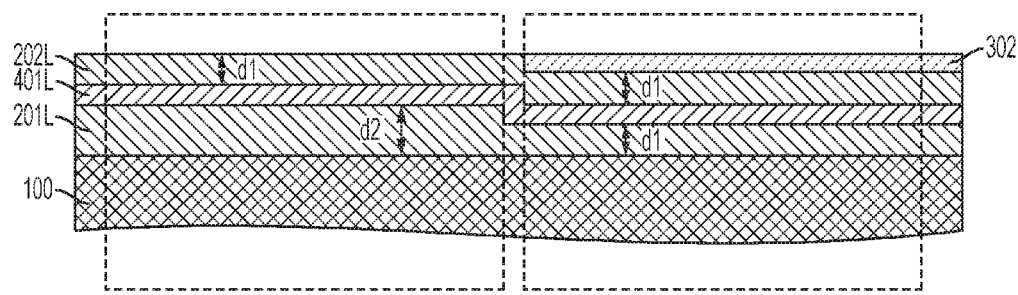
FIG. 5 shows the deposition of a second sacrificial gate layer onto the first semiconductor layer and the formation of a hard mask over the second sacrificial gate layer within the second device region of the substrate.

Referring to FIG. 5, the process continues with the blanket deposition of a second sacrificial gate layer 202L onto the first semiconductor layer 401L and the formation of a hard mask 302 over the second sacrificial gate layer 202L within the second device region (II) of the substrate. The same processes and materials used to form the first sacrificial gate layer 201L and hard mask layer 301 can be used to form the second sacrificial gate layer 202L and hard mask layer 302, respectively. As shown in the illustrated embodiment, the second sacrificial gate layer 202L may have an as-deposited layer thickness of d1.

Figure 6:
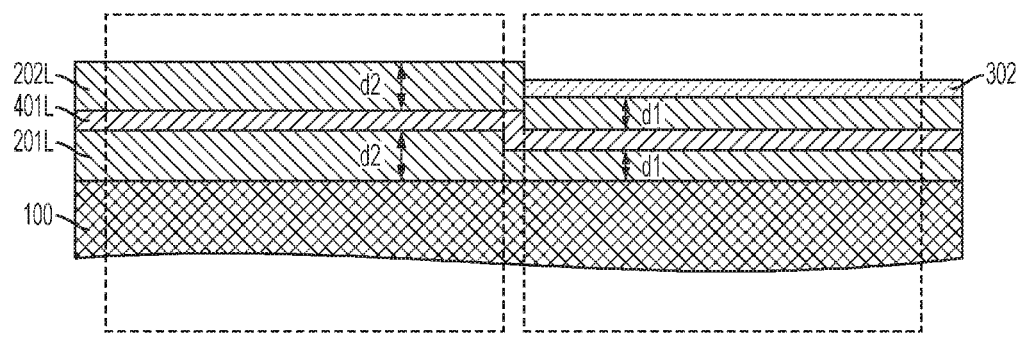
FIG. 6 depicts the selective deposition of additional sacrificial gate layer material within the first device region to form a second sacrificial gate layer within the first device region having the second thickness.

Then, referring to FIG. 6, using the patterned hard mask layer 302 as a block mask, a further epitaxial process is used to deposit additional sacrificial gate layer material within the first device region (I) to form a second sacrificial gate layer 202L within the first device region having a thickness (d2) greater than the first thickness (d1). By way of example, the further epitaxial process is used to deposit additional silicon germanium onto the exposed surface of the previously-formed silicon germanium layer 202L.

Figure 7:
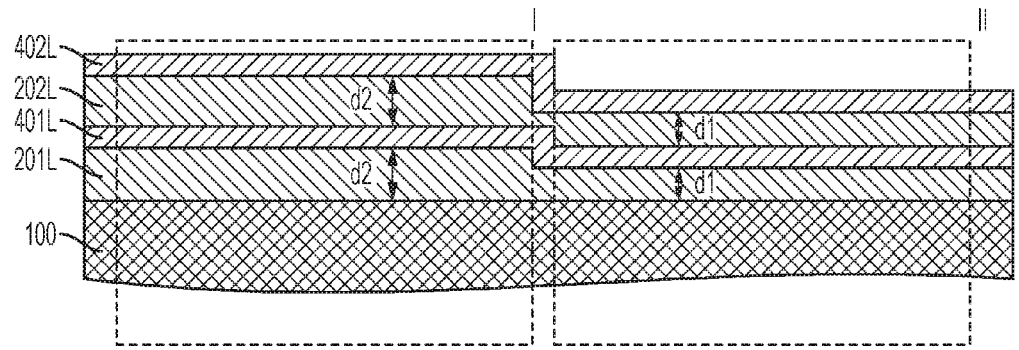
FIG. 7 shows the blanket deposition of a second semiconductor layer over the second sacrificial gate layer within each of the first and second device regions.

Referring to FIG. 7, following the thickness modification of the second sacrificial gate layer 202L within the first device region (I), the nitride hard mask 302 is removed and a second semiconductor layer 402L is formed over the second sacrificial gate layer 202L in each of the first and second device regions (I, II). In exemplary embodiments, second semiconductor layer 402L comprises silicon (Si) and may be formed using the processes and materials described above with respect to first semiconductor layer 401L.

Figure 8:
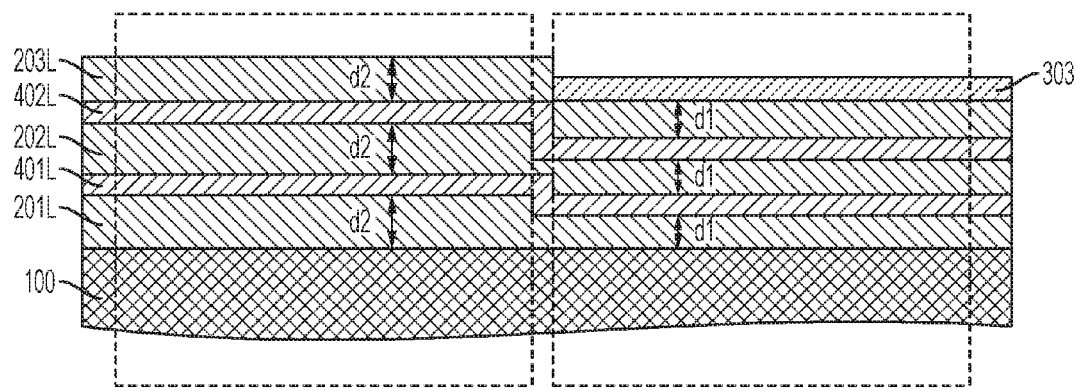
FIG. 8 shows the deposition onto the second semiconductor layer of a third sacrificial gate layer having a first thickness, the formation of a hard mask over the third sacrificial gate layer within the second device region, and the selective deposition of additional sacrificial gate layer material within the first device region to form a third sacrificial gate layer within the first device region having the second thickness.

FIG. 8 shows the epitaxial deposition onto the second semiconductor layer 402L of a third sacrificial gate layer 203L initially having a first thickness (d1), the formation of a hard mask 303 over the third sacrificial gate layer 203L within the second device region (II), and the selective epitaxial deposition (using hard mask 303 as a blocking mask) of additional sacrificial gate layer material within the first device region (I) to form a third sacrificial gate layer 203L within the first device region (I) having the second thickness (d2). The same processes and materials used to form the first and second sacrificial gate layers 201L, 202L and hard mask layers 301, 302 can be used to form the third sacrificial gate layer 203L and hard mask layer 303, respectively. The third sacrificial gate layer 202L may have an as-deposited layer thickness of d1. By way of example, the further epitaxial process is used to deposit additional silicon germanium onto the exposed surface of the previously-formed silicon germanium layer 203L.

Figure 9:
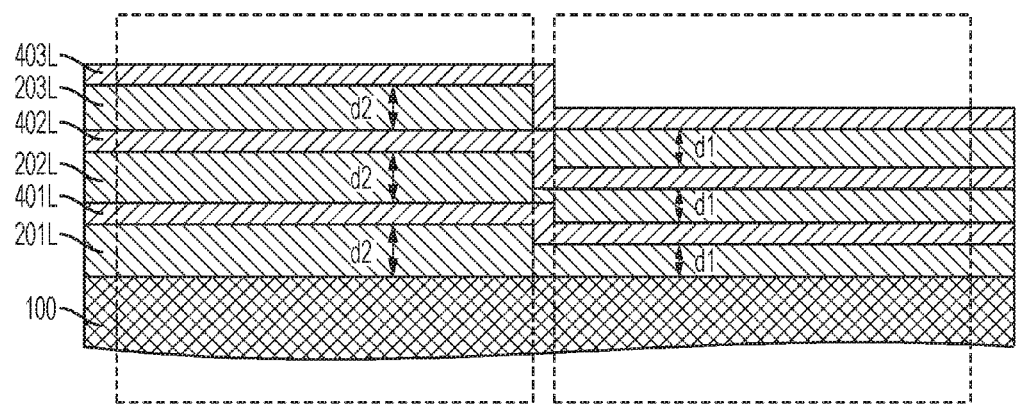
FIG. 9 shows the blanket deposition of a third semiconductor layer over the third sacrificial gate layer within the first and second device regions.

As illustrated in FIG. 9, following the thickness modification of the third sacrificial gate layer 203L within the first device region (I), the nitride hard mask 303 is removed and a third semiconductor layer 403L is formed over the third sacrificial gate layer 203L in each of the first and second device regions (I, II). In exemplary embodiments, third semiconductor layer 403L comprises silicon (Si) and may be formed using the processes and materials described above with respect to first and second semiconductor layers 401L, 402L.

The intermediate device architecture shown in FIG. 9 includes a first device region (I) having first, second, and third semiconductor layers 401L, 402L, 403L arranged at an intra-layer spacing equal to d2, and a second device region (II) having first, second, and third semiconductor layers 401L, 402L, 403L arranged at an intra-layer spacing equal to d1. In the illustrated embodiment, the first, second, and third semiconductor layers 401L, 402L, 403L have a constant thickness. By way of example, a thickness of the semiconductor layers 401L, 402L, 403L may be 1 to 20 nm, e.g., 1, 2, 4, 6, 8, 10, 12, 14, 16, 18 or 20 nm, including ranges between any of the foregoing values. As used herein, layers that are "substantially equal" in thickness differ in thickness by less than 5%, e.g., less than 2% or less than 1%. A layer having a "substantially constant" thickness has a thickness variation of less than 5%, e.g., less than 2% or less than 1%.

While the various embodiments disclosed herein include silicon germanium sacrificial gate layers 201L, 202L, 203L and silicon semiconductor layers 401L, 402L, 403L, other semiconductor materials may be used to form the device architecture. In this regard, the foregoing layer materials can be selected such that the semiconductor layers are adapted to form channel regions of a device, the sacrificial gate layers can be etched selectively with respect to the semiconductor layers, and each layer can be epitaxially grown one over the other (e.g., by homo- or hetery-epitaxy).

Referring to FIGS. 10-12, illustrated are example semiconductor devices at various stages of manufacture including a first nanowire field effect transistor formed on a semiconductor substrate within device region I, and a second nanowire field effect transistor formed on the semiconductor substrate within device region II.

The first nanowire field effect transistor formed in region I of the substrate of can include a gate architecture having a first gate stack configuration and a first threshold voltage. The second nanowire field effect transistor formed in region II of the substrate can include a gate architecture having a second gate stack configuration different from the first gate stack configuration, and a second threshold voltage different from the first threshold voltage.

The methods as described herein can be performed as part of a "gate last" or replacement metal gate (RMG) fabrication process where the sacrificial gate layers 201, 202, 203 are removed and replaced by functional gate structures. Thus, FIG. 10 shows an exemplary intermediate architecture within first and second device regions following additional processing, including a selective etch to remove the sacrificial gate layers and expose the semiconductor layers. Exposed portions of the semiconductor layers form nanowires 401, 402, 403, each comprising a respective channel region 421, 422, 423. A plurality of gate cavities 221, 222, 223 are formed by the removal of the sacrificial gate layers. In certain embodiments, the gate cavities radially envelop the channel regions, and within the first device region (I) have a height d2, while within the second device region (II) the gate cavities have a height d1.

Removal of the sacrificial gate layers can be achieved by any suitable etching process, such as dry or wet etching. In one example, isotropic dry etching such as ion beam etching, plasma etching or isotropic RIE may be used. In another example, isotropic wet etching may use etching solutions selective to the material subject to removal.

Because an etch rate of the silicon germanium sacrificial gate material used to form sacrificial gate layers 201L-203L can be faster than the etch rate of the semiconductor layers 401L-403L used to form channel regions 421-423, masking may not be needed for selective removal of the sacrificial material.

Details of some of the additional processing and the development of the accompanying device features will not be discussed in considerable detail so as to not obscure principle embodiments of the present invention. However, as will be appreciated, as shown in FIG. 10, the sacrificial gate layers and the semiconductor layer have been lithographically patterned to remove unwanted portions thereof to define nanowires 401, 402, 403, respectively comprising channel regions 421, 422, 423. As known to those skilled in the art, source/drain junctions 510 are formed over opposing distal ends of the nanowires 401-403, and an etch stop layer 520 is formed over the source/drain junctions 510. Sidewall spacers 530 and an interlayer dielectric 540 provide electrical isolation. The etch stop layer 520 and sidewall spacers 530 may comprise a nitride material such as silicon nitride, for example.

The interlayer dielectric (ILD) 540 can be a self-planarizing dielectric material such as a spin-on glass (SOG), or a non-planarizing dielectric material such as silicon oxide, silicon nitride, organosilicate glass, or combinations thereof. The interlayer dielectric 540 can be subsequently planarized, for example, by chemical mechanical planarization (CMP) such that top surfaces of the ILD 540, etch stop layer 520, spacer layer 530 and conductive fill layer 650 are substantially co-planar.

A gate stack comprising a gate dielectric and a gate conductor is then formed over the nanowires within channel regions 421-423 in each of the first and second device regions I, II. Referring to FIG. 11, a gate dielectric layer 610 such as a high dielectric constant (high-k) layer is formed on exposed surfaces of the channel regions 421-423 within the gate cavities 221-223. The high-k layer 610 may also contact inner sidewall surfaces of the gate spacers 530. In certain embodiments, the high-k layer 610 may be formed directly on the channel regions 421, 422, 423.

The gate dielectric layer 610 can be formed on the channel regions 421-423 using, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

In certain embodiments, the gate dielectric layer 610 includes a dielectric metal oxide having a dielectric constant that is greater than the dielectric constant of silicon dioxide. By way of example, the gate dielectric layer 610 can have a dielectric constant greater than 4. In certain embodiments, the gate dielectric layer 610 can have a dielectric constant greater than 8.

By way of example, the gate dielectric material can include a material selected from hafnium oxide, zirconium oxide, tantalum oxide, titanium oxide, silicates of thereof, and alloys thereof. The thickness of the gate dielectric layer 610 may be 1 nm to 6 nm, e.g., 1, 2, 4 or 6 nm, including ranges between any of the foregoing values.

Referring to FIG. 12, illustrated is the deposition of a gate conductor 620 (e.g., work function metal layer) to fill remaining portions of the gate cavities, followed by the deposition of a conductive fill layer 650. A CMP process can be used to planarize the top surface of the structure. The thickness of the gate conductor 620 is mediated by the gate cavity dimensions, which, in turn, defines the threshold voltage ($V_t$) for a given device.

In an illustrative example, a work function material layer 620 can be deposited directly on the gate dielectric layer 610. The work function material layer 620 can include an elemental composition or a metallic compound, which includes a metal and a non-metal element. The metallic compound can be selected from metallic nitrides, tantalum carbide, and hafnium-silicon alloys, for example. Exemplary metallic nitrides include titanium nitride, tantalum nitride, tungsten nitride, and combinations thereof.

The work function material layer 620 can be formed by physical vapor deposition, chemical vapor deposition, or atomic layer deposition (ALD). The thickness of the work function material layer 620 is pre-set by the cavity dimensions, but typically ranges from 1 nm to 30 nm, although lesser and greater thicknesses can also be used.

Each of spacer layer 530, interlayer dielectric 540, gate dielectric 610, gate conductor 620 and conductive fill layer 650 can be deposited using any of a variety of deposition processes, including, for example, physical vapor deposition (PVD), atomic layer deposition (ALD), chemical vapor deposition (CVD), or other known processes.

As will be appreciated, the exemplary semiconductor structure can include various device regions. In the non-limiting illustrative example, the semiconductor structure can include a first device region (I) and a second device region (II). Additional device regions (not shown) can be provided for the purpose of forming additional devices.

In various embodiments, FETs of a common (p or n) channel polarity within different device regions can have different gate stack configurations and different threshold voltages. A first device region can include a FET having a first gate stack configuration and a super low threshold voltage (SLVT), a second region can include a FET having a second gate stack configuration and a low threshold voltage (LVT), and a third region can include a FET having a third gate stack configuration and a regular threshold voltage (RVT), for example.

Devices may include a pFET or an nFET, as will be appreciated by those skilled in the art. For instance, in certain embodiments the nanowire FET of region I can be an nFET having a regular voltage threshold (RVT) and the nanowire FET of region II can be an nFET having a low voltage threshold (LVT) or a super low voltage threshold (SLVT); or the nanowire FET of region I can be an nFET having a low voltage threshold (LVT) and the nanowire FET of region II can be an nFET having a super low voltage threshold (SLVT).

In alternate embodiments, referring still to FIG. 12, the nanowire FET of region I can be a pFET having a super low voltage threshold (SLVT) and the nanowire FET of region II can be a pFET having a low voltage threshold (LVT) or a regular voltage threshold (RVT); or the nanowire FET of region I can be a pFET having a low voltage threshold (LVT) and the nanowire FET of region II can be a pFET having a regular voltage threshold (RVT).

In one embodiment, a voltage difference between an SLVT threshold voltage and an LVT threshold voltage of FETs having different gate stack configurations formed in different regions of semiconductor substrate 100 having a common channel polarity can be at least 10 mV, e.g., 10, 50, 100, 200, 500 or 1000 mV, including ranges between any of the foregoing values.

In one embodiment, a voltage difference between an LVT threshold voltage and an RVT threshold voltage of FETs having different gate stack configurations formed in different regions of semiconductor substrate 100 having a common channel polarity can be at least 10 mV, e.g., 10, 50, 100, 200, 500 or 1000 mV, including ranges between any of the foregoing values.

In certain embodiments, a threshold voltage can be tuned by varying gate stack configurations amongst the device regions I, II, etc. without varying doping profiles throughout the regions. In certain embodiments, threshold voltage can be tuned by varying gate stack configurations between the regions without varying any process variable other than the thickness of a gate conductor layer. Tuning of threshold voltage $V_t$ without varying a doping profile can minimize or eliminate implant induced device performance degradation and variability.

In one embodiment, each semiconductor layer and/or each associated nanowire can include an intrinsic single crystalline semiconductor material. Alternately, one or more of the semiconductor layers and/or nanowires can include a doped semiconductor material. In one embodiment, each of the nanowires within device region I can be intrinsic or can have a doping of a first conductivity type, and each of the nanowires within device region II can be intrinsic or can have a doping of a second conductivity type, which is the opposite of the first conductivity type. For example, the first conductivity type can be p-type and the second conductivity type can be n-type, or vice versa.

Each nanowire 401-403 can include a semiconductor material that is independently selected from silicon, germanium, a silicon-germanium alloy, a silicon carbon alloy, silicon-germanium-carbon alloys, gallium arsenide, indium arsenide, indium phosphide, III-V compound semiconductor materials, II-VI compound semiconductor materials, organic semiconductor materials, and other compound semiconductor materials. As used herein, a "semiconductor material" of an element refers to all elemental or compound semiconductor materials of the element excluding the electrical dopants therein. The semiconductor material within each nanowire can be the same throughout the entirety of that nanowire.

As used herein, the singular forms "a," "an" and "the" include plural referents unless the context clearly dictates otherwise. Thus, for example, reference to a "nanowire" includes examples having two or more such "nanowires" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a sacrificial gate layer that comprises silicon germanium include embodiments where a sacrificial gate layer consists essentially of silicon germanium and embodiments where a sacrificial gate layer consists of silicon germanium.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a structure, comprising:
   depositing a first sacrificial layer on a semiconductor substrate, the first sacrificial layer having a first thickness in a first region of the substrate and a second thickness greater than the first thickness in a second region of the substrate;
   depositing a first semiconductor layer on the first sacrificial layer;
   depositing a second sacrificial layer on the first semiconductor layer, wherein a thickness of the second sacrificial layer within the first region of the substrate is substantially equal to the first thickness, and a thickness of the second sacrificial layer within the second region of the substrate is substantially equal to the second thickness; and
   depositing a second semiconductor layer on the second sacrificial layer.

2. The method of claim 1, further comprising:
   selectively etching the first and second sacrificial layers to form first cavities within the first region and second cavities within the second region; and
   depositing a dielectric layer on the first semiconductor layer within the first cavities and on the second semiconductor layer within the second cavities.

3. The method of claim 2, further comprising:
   depositing a work function metal layer on the dielectric layer within the first cavities and on the dielectric layer within the second cavities, wherein the work function metal layer substantially fills the first and second cavities.

4. The method of claim 1, wherein the second thickness is 5% to 400% greater than the first thickness.

5. The method of claim 1, wherein the first semiconductor layer has a substantially constant thickness and the second semiconductor layer has a substantially constant thickness.

6. The method of claim 5, wherein the thickness of the first semiconductor layer is substantially equal to the thickness of the second semiconductor layer.

7. The method of claim 1, wherein the first and second sacrificial layers comprise silicon germanium and the first and second semiconductor layers comprise elemental silicon.

8. The method of claim 1, wherein the first semiconductor layer is deposited directly on the first sacrificial layer and the second semiconductor layer is deposited directly on the second sacrificial layer.

9. The method of claim 1, wherein depositing the first and second semiconductor layers comprise hetero-epitaxial deposition.

10. The method of claim 1, wherein the first sacrificial layer is deposited directly on the substrate and the second semiconductor layer is deposited directly on the first semiconductor layer.

11. The method of claim 1, wherein depositing the first and second sacrificial layers comprise hetero-epitaxial deposition.

12. The method of claim 1, further comprising forming a first blocking mask over the first sacrificial layer within the first region prior to depositing additional first sacrificial layer material within the second region, and forming a second blocking mask over the second sacrificial layer within the first region prior to depositing additional second sacrificial layer material within the second region.

13. The method of claim 12, wherein depositing the additional first sacrificial layer material and depositing the additional second sacrificial layer material comprise homo-epitaxial deposition.

14. The method of claim 12, further comprising removing the first blocking mask prior to depositing the first semiconductor layer and removing the second blocking mask prior to depositing the second semiconductor layer.

15. The method of claim 12, wherein the first blocking mask comprises silicon nitride or silicon oxynitride and the second blocking mask comprises silicon nitride or silicon oxynitride.

16. The method of claim 2, wherein the dielectric layer comprises a high-k dielectric.

17. The method of claim 3, wherein the dielectric layer comprises hafnium oxide and the work function metal layer comprises titanium nitride.

18. A method of forming a structure, comprising:
   depositing a first sacrificial layer on a semiconductor substrate, the first sacrificial layer having a first thickness;
   forming a first blocking mask over the first sacrificial layer within a first region of the substrate;
   depositing additional first sacrificial layer material within the second region to form a first sacrificial layer within the second region having a second thickness greater than the first thickness;
   depositing a first semiconductor layer on the first sacrificial layer;
   depositing a second sacrificial layer on the first semiconductor layer, the second sacrificial layer having the first thickness;
   forming a second blocking mask over the second sacrificial layer within the first region of the substrate;
   depositing additional second sacrificial layer material within the second region to form a second sacrificial layer within the second region having the second thickness;

depositing a second semiconductor layer on the second sacrificial layer;

selectively etching the first and second sacrificial layers to form first cavities within the first region and second cavities within the second region;

depositing a dielectric layer on the first semiconductor layer within the first cavities and on the second semiconductor layer within the second cavities; and depositing a work function metal layer on the dielectric layer within the first cavities and on the dielectric layer within the second cavities, wherein the work function metal layer substantially fills the first and second cavities.

19. The method of claim 18, wherein depositing the first and second semiconductor layers comprise hetero-epitaxial deposition.

20. The method of claim 18, wherein depositing the additional first sacrificial layer material and depositing the additional second sacrificial layer material comprise homo-epitaxial deposition.

* * * * *